United States Patent
Takahashi

(10) Patent No.: US 7,382,306 B2
(45) Date of Patent: Jun. 3, 2008

(54) AD CONVERTER AND DISPLAY UNIT

(75) Inventor: Ken Takahashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/557,302

(22) Filed: Nov. 7, 2006

(65) Prior Publication Data

US 2007/0109172 A1 May 17, 2007

(30) Foreign Application Priority Data

Nov. 11, 2005 (JP) .............................. 2005-327908

(51) Int. Cl.
*H03M 1/34* (2006.01)

(52) U.S. Cl. .................... 341/158; 341/118; 341/155; 341/156; 341/138; 345/89; 345/110; 345/111; 345/112

(58) Field of Classification Search ................ 341/155, 341/159, 118, 120, 156, 158; 345/89, 210–212
See application file for complete search history.

(56) References Cited

U.S. PATENT DOCUMENTS

| | | | | |
|---|---|---|---|---|
| 4,990,917 A | * | 2/1991 | Kohdaka | .................... 341/159 |
| 5,343,201 A | * | 8/1994 | Takayama et al. | .......... 341/200 |
| 5,610,604 A | * | 3/1997 | Leacock et al. | ............ 341/138 |
| 6,373,423 B1 | * | 4/2002 | Knudsen | ...................... 341/159 |
| 6,617,991 B2 | * | 9/2003 | Kaul et al. | ................... 341/155 |
| 6,888,526 B2 | * | 5/2005 | Morita | ......................... 345/95 |
| 7,079,127 B2 | * | 7/2006 | Morita | ....................... 345/212 |
| 7,212,144 B1 | * | 5/2007 | Sutardja | ..................... 341/159 |
| 2003/0043066 A1 | * | 3/2003 | Otsuka et al. | .............. 341/158 |
| 2007/0057884 A1 | * | 3/2007 | Akai et al. | .................... 345/89 |

FOREIGN PATENT DOCUMENTS

| | | |
|---|---|---|
| JP | 2004-48327 | 2/2004 |
| JP | 2005-327908 | 11/2005 |

* cited by examiner

*Primary Examiner*—Linh V Nguyen
(74) *Attorney, Agent, or Firm*—Oblon, Spivak, McClelland, Maier & Neustadt, P.C.

(57) ABSTRACT

An AD converter includes: a reference voltage generator circuit having a plurality of resistors connected in series with predetermined reference voltage applied to both ends thereof, the reference voltage being divided at connecting points between the individual resistors to generate a plurality of reference voltages; a voltage comparator circuit configured to compare the plurality of reference voltages and analog input signals for conversion into predetermined comparison output signals; and a variable voltage circuit connected to the connecting points of the reference voltage generator circuit and provided with a control signal input terminal inputted with control signals, configured to set an output voltage to be outputted to the connecting points at a predetermined value based on the control signals.

19 Claims, 6 Drawing Sheets

AD CONVERTER AND DISPLAY UNIT

CROSS-REFERENCE TO RELATED APPLICATIONS

This application is based upon and claims the benefit of priority from the prior Japanese Patent Application No. 2005-327908 filed on Nov. 11, 2005; the entire contents of which are incorporated herein by reference.

BACKGROUND OF THE INVENTION

1. Field of the Invention

The present invention relates to an AD converter for converting analog signals into digital signals of a predetermined number of bits and for outputting the digital signals, and relates to a display unit.

2. Description of Related Art

In a display unit, such as a television, analog signals picked up by an image pickup device, such as a charge coupled device (hereinafter referred to as CCD), are converted to digitized image signals by an AD converter, and an image is displayed based on the digitized image signals. As an AD converter for digitizing analog image signals in a display unit, a parallel AD converter is generally used, which is configured to collectively compare reference voltages of different voltage values with analog input voltages.

In case of displaying an image whose contrast is low, such as an overall dark image, digital image signals after AD conversion are subjected to image correction, such as contrast adjustment. Further, image analysis, such as histogram analysis, is carried out for the digital image signals after the AD conversion, and based on the results of the analysis, image correction is controlled. In performing the contrast adjustment, a quantization width (voltage corresponding to 1 bit) for digital image signals falling in contrast-enhancing ranges is expanded, and a quantization width for digital image signals falling in other ranges is narrowed according to the contents of control that has been determined based on the image analysis. Thus, in case an AD converter imparting all ranges with an equal quantization width, or having linear characteristics, is used in digitizing image signals, a quantization width for the image signals provided with the contrast adjustment and falling within the contrast-enhancing ranges is expanded. As a result, qualities of an image displayed on the display unit are deteriorated. In order to avoid this, as disclosed in Japanese Patent Laid-Open No. 2004-048327, an AD converter having nonlinear characteristics is used, which performs digitization of image signals in such a way as to make narrower a quantization width for the image signals within the contrast-enhancing regions than that of other ranges.

The AD converter described in Japanese Patent Laid-Open No. 2004-048327 includes: a series of resistors in which a plurality of resistors are connected in series with a predetermined reference voltage applied to both ends thereof, the reference voltage being divided at connecting points between the individual resistors to produce a plurality of reference signals; a plurality of comparators for comparing voltages of the plurality of reference signals with voltages of analog image signals for conversion into comparison output signals of either a logic "0" or a logic "1"; and an encoder for outputting digital image signals (digital codes) of a predetermined number of bits based on the comparison output signals which are outputted from the comparators. In the AD converter mentioned above, a resistance of each resistor in the series of resistors is differentiated from the others to differentiate at each resistor an amount of voltage, or a quantization width, for convertible analog image signals, so that nonlinear characteristics are realized.

In the AD converter described in Japanese Patent Laid-Open No. 2004-048327, conversion characteristics are fixedly set in advance because the resistance of each resistor in the series of resistors is fixed. On the other hand, an expansion rate for the digital signals in the contrast-enhancing ranges in performing contrast adjustment is changed according to characteristics or the like of analog image signals as inputted. Under such circumstances, a problem has been raised that a mismatch occurs between a quantization width required for the contrast-enhancing ranges at the time of performing contrast adjustment, and a quantization width at the time of performing actual digital conversion.

BRIEF SUMMARY OF THE INVENTION

An AD converter according to one embodiment of the present invention includes: a reference voltage generator circuit having a plurality of resistors connected in series with predetermined reference voltage applied to both ends thereof, the reference voltage being divided at connecting points between the individual resistors to generate a plurality of reference voltages; a voltage comparator circuit configured to compare the plurality of reference voltages and analog input signals for conversion into predetermined comparison output signals; and a variable voltage circuit connected to the connecting points of the reference voltage generator circuit and provided with a control signal input terminal inputted with control signals, configured to set an output voltage to be outputted to the connecting points at a predetermined value based on the control signals.

A display unit according to one embodiment of the present invention includes: an AD conversion part including a reference voltage generator circuit having a plurality of resistors connected in series with predetermined reference voltage applied to both ends thereof, the reference voltage being divided at connecting points between the individual resistors to generate a plurality of reference voltages, a voltage comparator circuit configured to compare the plurality of reference voltages and analog image signals for conversion into predetermined comparison output signals, and a variable voltage circuit connected to the connecting points of the reference voltage generator circuit and provided with a control signal input terminal inputted with control signals, configured to set an output voltage to be outputted to the connecting points at a predetermined value based on the control signals; an image analysis part configured to analyze digital image signals outputted from the AD conversion part to output the voltage control signals and image correction signals; and an image correction part configured to correct and process the digital image signals based on the image correction signals.

DETAILED DESCRIPTION OF THE EMBODIMENTS OF THE INVENTION

Hereinafter are described some embodiments of the present invention with reference to the accompanying drawings.

Figure 1:
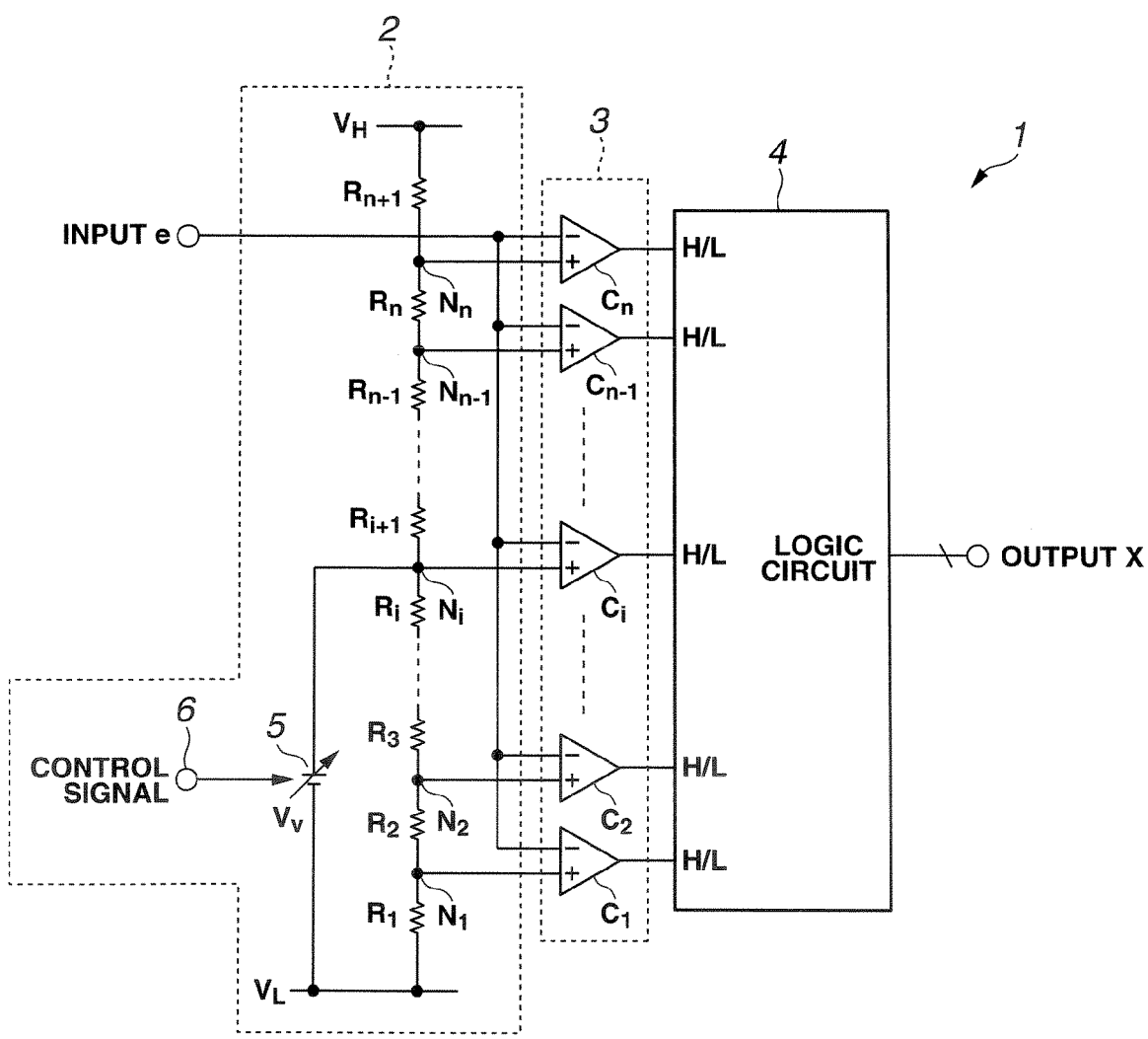
FIG. 1 is a schematic circuit diagram for explaining a configuration of an AD converter 1 according to an embodiment of the present invention.

First of all, a configuration of an AD converter 1 according to an embodiment of the present invention is described with reference to FIG. 1. FIG. 1 is a schematic circuit diagram for explaining a configuration of the AD converter 1 according to an embodiment of the present invention. As shown in FIG. 1, the AD converter 1 of the present embodiment includes a reference voltage generator circuit 2 for generating reference signals to be compared with inputted analog image signals "e", a comparator circuit 3 for comparing the reference signals with the analog image signals, and a logic circuit 4 for producing digital image signals (digital codes) "x" based on the comparison results in the comparator circuit 3.

The reference voltage generator circuit 2 has an "n+1" number of resistors $R_1$ to $R_{n+1}$ in cascade connection with a reference voltage $V_H$ applied to an open end of the higher potential resistor $R_{n+1}$ and a reference voltage $V_L$ applied to an open end of the lower potential resistor $R_1$. The resistors $R_2$ to $R_n$ are each adapted to exhibit substantially an equal resistance, while the resistors $R_1$ and $R_{n+1}$ are adapted to exhibit half a resistance of each of the resistors $R_2$ to $R_n$. It should be appreciated that, due to variation or the like induced by the individual difference between the resistors, the resistances of the resistors $R_2$ to $R_n$ may not be completely equal. In addition, as the resistors $R_1$ to $R_n$, an "n+1" number of resistors having substantially an equal resistance to each other may be used.

An "n" number of reference voltage nodes $N_1$ to $N_n$ are formed at connecting points between the individual resistors $R_1$ to $R_{n+1}$. Further, the open end of the resistor $R_1$ on the lower potential side and the reference voltage node Ni ("i" represents a preset number between "1" to "n") are connected to each other through a variable voltage generator 5. A voltage $V_V$ of the variable voltage generator 5, or a variable voltage circuit, is controlled to be a desired value by a control signal inputted from outside through a voltage control signal input terminal 6.

Thus, the reference voltage nodes $N_1$ to $N_i$ output reference voltages $Vref_1$ to $Vref_i$ obtained by dividing the reference voltages $V_L$ to $V_H$ between the resistors $R_1$ to $R_i$, and the reference voltage nodes $N_{i+1}$ to $N_n$ output reference voltages $Vref_{i+1}$ to $Vref_n$ obtained by dividing the reference voltages $V_V$ to $V_H$ between the resistors $R_{i+1}$ to $R_{n+1}$.

Figure 2:
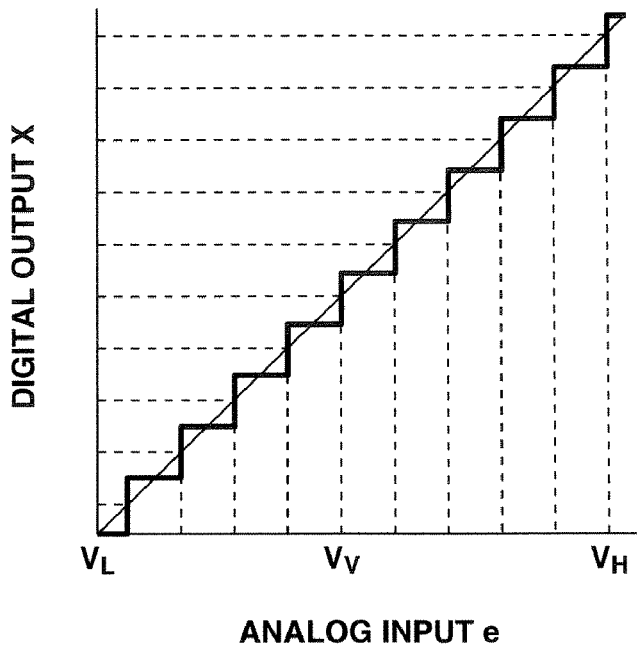
FIG. 2 is a conversion characteristics diagram of the AD converter 1 where $V_V=(V_L+V_H)/2$, according to an embodiment of the present invention.
Figure 3:
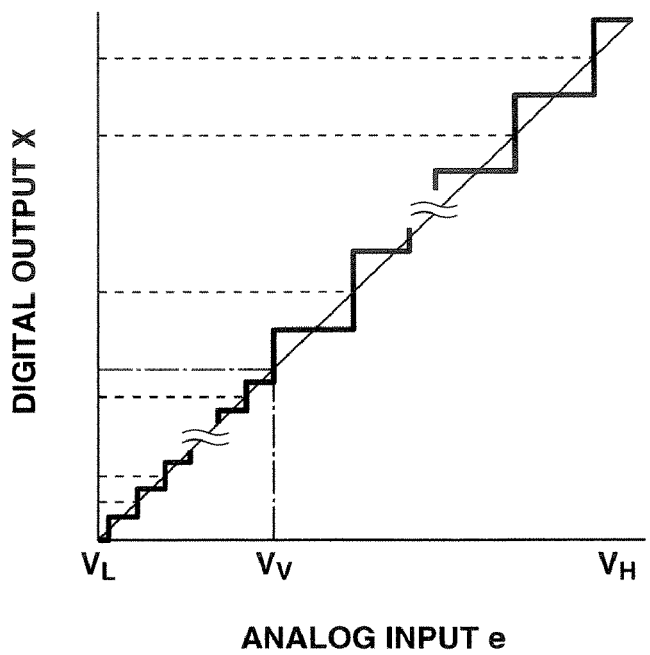
FIG. 3 is a conversion characteristics diagram of the AD converter 1 where $V_V<(V_L+V_H)/2$, according to an embodiment of the present invention.

For example, where the variable voltage generator 5 is connected to the reference voltage node $N_{(n/2)}$ and a relation $V_V=(V_L+V_H)/2$ is established, potential intervals between the reference voltages $Vref_1$ to $Vref_n$ become equal to each other. Where a relation $V_V<(V_L+V_H)/2$ is established, potential intervals between the reference voltages $Vref_1$ to $Vref_i$ are equal to each other and those between the reference voltages $Vref_{i+1}$ to $Vref_n$ are equal to each other. However, a potential difference (which is a "quantization width") between juxtaposed reference nodes in the reference voltage nodes $N_1$ to $N_i$ becomes smaller than a potential difference between juxtaposed reference nodes in the reference voltage nodes $N_{i+1}$ to $N_n$ (see FIGS. 2 and 3). FIG. 2 is a conversion characteristics diagram of the AD converter 1 where $V_V=(V_L+V_H)/2$ and FIG. 3 is a conversion characteristics diagram of the AD converter 1 where $V_V<(V_L+V_H)/2$. Each of FIGS. 2 and 3 shows conversion characteristics, with the horizontal axis indicating analog image signals "e" inputted to the AD converter 1, and the vertical axis indicating the digital image signals (digital codes) "x" which are outputted after being digitized by the AD converter 1. In this way, application of the voltage $V_V$ to the reference voltage node $N_i$ by the variable voltage generator 5 can differentiate potential differences of the reference voltage between juxtaposed nodes, the reference voltage node $N_i$ being a border, thereby enabling the conversion characteristics of the AD converter 1 to be adjusted by control of the voltage $V_V$.

The comparator circuit 3 is made up of an "n" number of comparators $C_1$ to $C_n$ each serving as a voltage comparator circuit. The reference voltages $Vref_1$ to $Vref_n$ outputted from the reference voltage nodes $N_1$ to $N_n$, respectively, are inputted to inversion input terminals (+ terminals) of the comparators $C_1$ to $C_n$, respectively, while an input voltage Vin of analog image signals is inputted to each of non-inversion input terminals (− terminals). In the individual comparators $C_1$ to $C_n$, the respective reference voltages $Vref_1$ to $Vref_n$ and the analog input voltages Vin are collectively compared. As a result, when the analog input voltage Vin is higher than each of the voltages $Vref_1$ to $Vref_n$, a higher voltage "H" is outputted to the logic circuit 4, and when lower, a lower voltage "L" is outputted to the logic circuit 4. In the logic circuit 4, the digital codes are produced based on the outputs from the comparator circuit 3 for output as the digital image signals "x".

Figure 4:
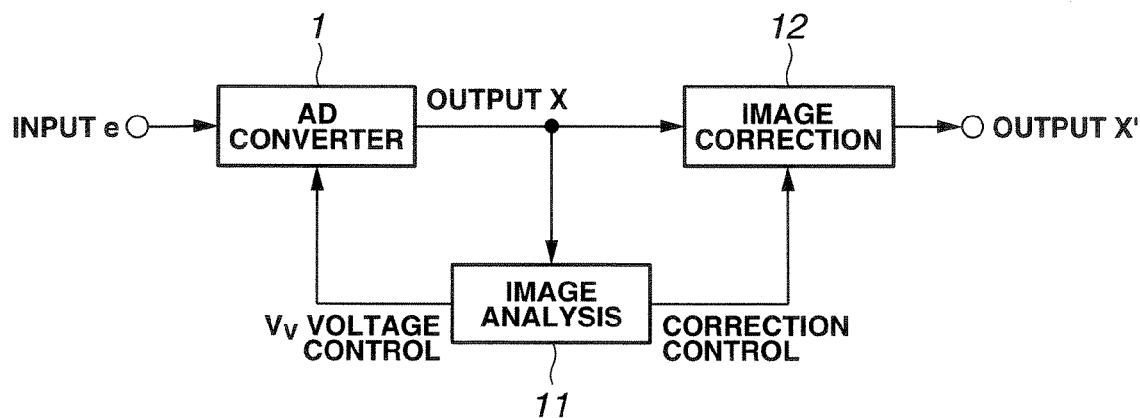
FIG. 4 is a block diagram for explaining one example of a configuration of a display unit using the AD converter 1 according to an embodiment of the present invention.

A display unit using the AD converter 1 according to the present embodiment is described below with reference to FIG. 4. FIG. 4 is a block diagram for explaining one example of a configuration of the display unit using the AD converter 1. As shown in FIG. 4, the AD converter 1 is electrically connected to an image analysis unit 11 and an image correction unit 12. In the AD converter 1, analog image signals inputted from a CCD, not shown, for example, are converted to digital image signals for output to the image analysis unit 11 and the image correction unit 12.

In the image analysis unit 11, various analyses, including histogram analysis, are carried out for the digital image signals "x" inputted from the AD converter 1 to determine contents of image correction, such as contrast adjustment, based on the results of the analyses. Further, the image analysis unit 11 outputs control signals for image correction to the image correction unit 12 based on the contents of the determined image correction. The image analysis unit 11 also outputs control signals associated with the voltage $V_V$ of the variable voltage generator 5 to the AD converter 1 based on the contents of the determined image correction. In the AD converter 1, the voltage $V_V$ of the variable voltage generator 5 is set based on the control signals inputted from the image analysis unit 11.

For example, in case the analog image signals "e" converged to low-voltage regions, i.e. image signals of dark and low contrast, are inputted to the image analysis unit 11 through the AD converter 1, the image analysis unit 11 determines image correction, so that a quantization width for the low-voltage region image signals is expanded at an expansion rate of "a" to enhance contrast, and a quantization width for image signals of other regions is narrowed at an expansion rate of "b" to reduce contrast. The image analysis unit 11 outputs the expansion rate "a" for the contrast-enhancing regions and the expansion rate "b" for the contrast-reducing regions to the image correction unit 12 as control signals for image correction. At the same time, the image analysis unit 11 outputs control signals to the AD converter 1 indicating that the quantization width for the contrast-enhancing regions is narrowed at an expansion rate of "a'" and the quantization width of the contrast reducing regions is expanded at an expansion rate of "b'".

In the AD converter 1, the voltage $V_V$ of the variable voltage generator 5 is set based on the control signals inputted from the image analysis unit 11. In this case, in order to narrow the quantization width for the low-voltage regions for enhancing contrast and to expand the quantization width for other regions for reducing contrast, the voltage $V_V$ is set to be smaller than $(V_L+V_H)/2$. In this way, the image analysis unit 11 immediately analyzes the digital image signals inputted from the AD converter 1, so that the control signals for changing the voltage $V_V$ of the variable voltage generator 5 are sequentially fed back to the AD converter 1. Therefore, the AD converter 1 can dynamically change the conversion characteristics so that digital image signals suitable for attaining a good-quality image can be obtained.

Figure 5:
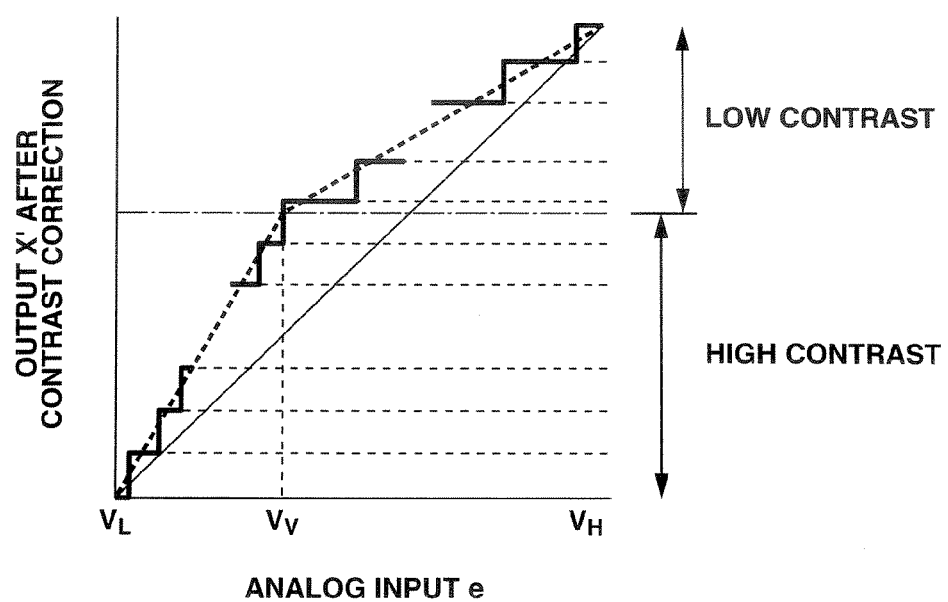
FIG. 5 is a conversion characteristics diagram showing analog image signals in relation to digital image signals after contrast processing, according to an embodiment of the present invention.

In the image correction unit 12, image correcting process, such as contrast correction, is carried out for the digital image signals inputted from the AD converter 1, in accordance with the control signals for image correction inputted from the image analysis unit 11. In this regard, the digital image signals being imparted with the image correction processing and outputted from the image correction unit 12 are controlled in the expansion rates "a", "a'", "b" and "b'" as shown in FIG. 5, so that the quantization width for the contrast-enhanced regions and that for the contrast-reduced regions become substantially equal to each other to display a good-quality image. FIG. 5 is a conversion characteristics diagram showing the analog image signals in relation to the digital image signals after contrast processing. It should be noted that conversion characteristics diagram shown in FIG. 5 is of the case where the digital image signals having conversion characteristics of FIG. 2 where $V_V<(V_L+V_H)/2$ and outputted from the AD converter 1, have been subjected to contrast processing. The digital image signals being imparted with the image correction processing are outputted from the image correction unit 12 and displayed on a monitor or the like through various downstream processes, not shown, if required.

As described above, in the AD converter 1 according to the present embodiment, by connecting the variable voltage generator 5 to the reference voltage node $N_i$ and by changing the voltage $V_V$ based on the control signals provided from outside, the potential difference between the juxtaposed nodes that are present between the reference voltage nodes $N_1$ and $N_i$ can be differentiated from the potential difference between the juxtaposed nodes that are present between the reference voltage nodes $N_{i+1}$ and $N_n$, the reference voltage node $N_i$ being a border, thereby realizing the non-linear characteristics and dynamically changing the conversion characteristics.

In the embodiments described above, the variable voltage generator 5 has been connected to only one reference voltage node $N_i$ to apply a predetermined voltage thereto for realization of the conversion characteristics having one curving point. However, in order to realize conversion characteristics having a plurality of curving points, a plurality of variable voltage generators may be connected to a plurality of respective reference nodes to apply predetermined voltages thereto.

Figure 6:
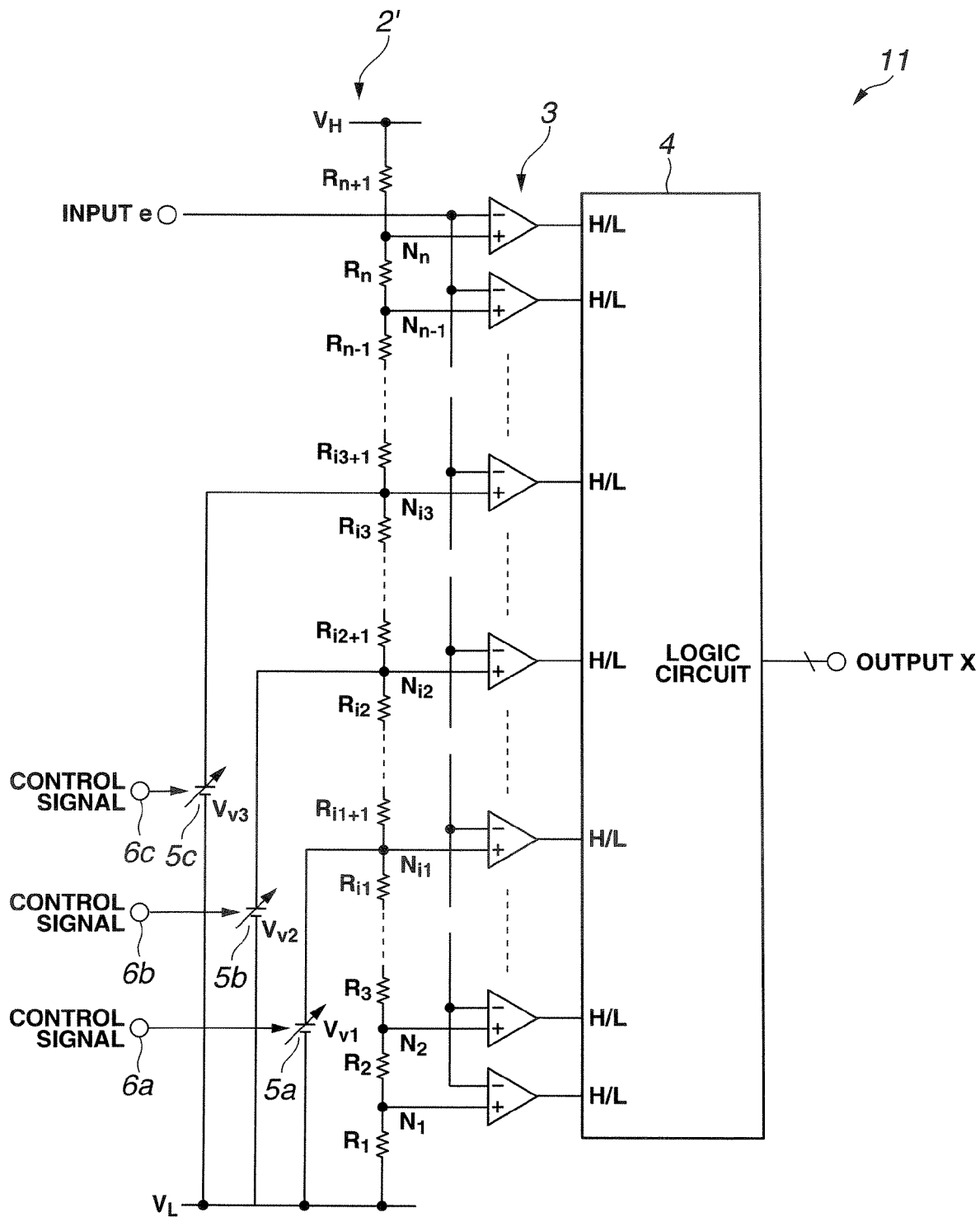
FIG. 6 is a schematic circuit diagram for explaining a configuration of another AD converter 11 according to an embodiment of the present invention.

For example, in case of realizing conversion characteristics having three curving points, an AD converter 11 may be so configured that, as shown in FIG. 6, three variable voltage generators 5a, 5b and 5c, each of which is connected to an open end of a lower potential resistor $R_1$ at one end thereof, are connected to three different reference nodes $N_{i1}$, $N_{i2}$ and $N_{i3}$, respectively, at the other end of each of the three variable voltage generators 5a, 5b and 5c, and predetermined voltages ($V_{V1}$, $V_{V2}$ and $V_{V3}$, where $V_L<V_{V1}<V_{V2}<V_{V3}<V_H$) are applied to the variable voltage generators 5a, 5b and 5c. FIG. 6 is a schematic circuit diagram for explaining the configuration of the AD converter 11 according to an embodiment of the present invention.

Figure 7:
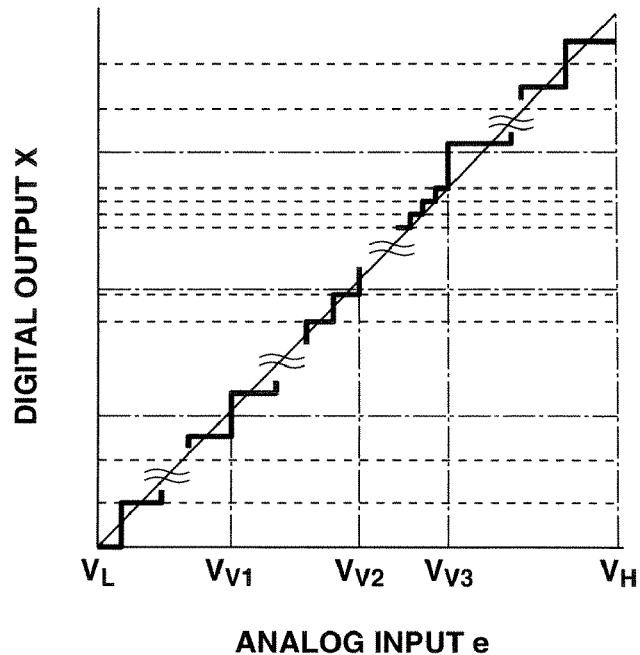
FIG. 7 is a diagram showing one example of conversion characteristics of the AD converter 11 according to an embodiment of the present invention.

As shown in FIG. 7, by adjusting the voltages $V_{V1}$, $V_{V2}$ and $V_{V3}$ to desired values under the control of signals from outside, such as from the image analysis unit 11, inputted through voltage control signal input terminals 6a, 6b and 6c, quantization widths for the reference nodes $N_1$ to $N_{i1}$ and the reference nodes $N_{i3}$ to $N_n$ can be expanded, and a quantization width for the reference nodes $N_{i2}$ to $N_{i3}$ can be narrowed. FIG. 7 shows one example of conversion characteristics of the AD converter 11. FIG. 7 shows the conversion characteristics with the horizontal axis indicating analog image signals "e" inputted to the AD converter 11, and the vertical axis indicating digital image signals (digital codes) "x" outputted from the AD converter 11 being digitized.

Figure 8:
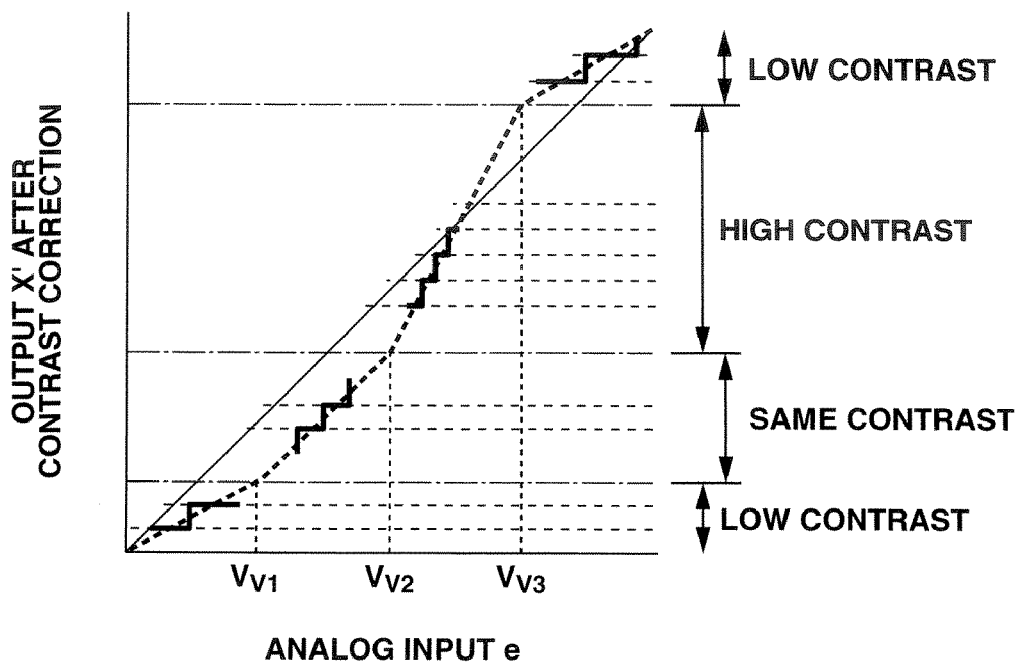
FIG. 8 is a conversion characteristics diagram showing analog image signals in relation to digital image signals after contrast processing, according to an embodiment of the present invention.

For the digital image signals that have been subjected to AD conversion to have the characteristics as shown in FIG. 7, a contrast correction process is performed in the image correction unit 12, so that the quantization widths for the regions corresponding to the reference nodes $N_1$ to $N_{i1}$ and the reference nodes $N_{i3}$ to $N_n$ are narrowed to reduce contrast, and quantization width for the region corresponding to the reference nodes $N_{i2}$ to $N_{i3}$ is expanded to enhance contrast. As a result, as shown in FIG. 8, in all the regions, i.e. in the contrast-enhanced region, the contrast-unchanged region and the contrast-reduced region, the quantization widths can be made substantially equal to each other to ensure displaying of a good-quality image. FIG. 8 is a conversion characteristics diagram showing a relation between the analog image signals and the digital image signals after the contrast processing.

Figure 9:
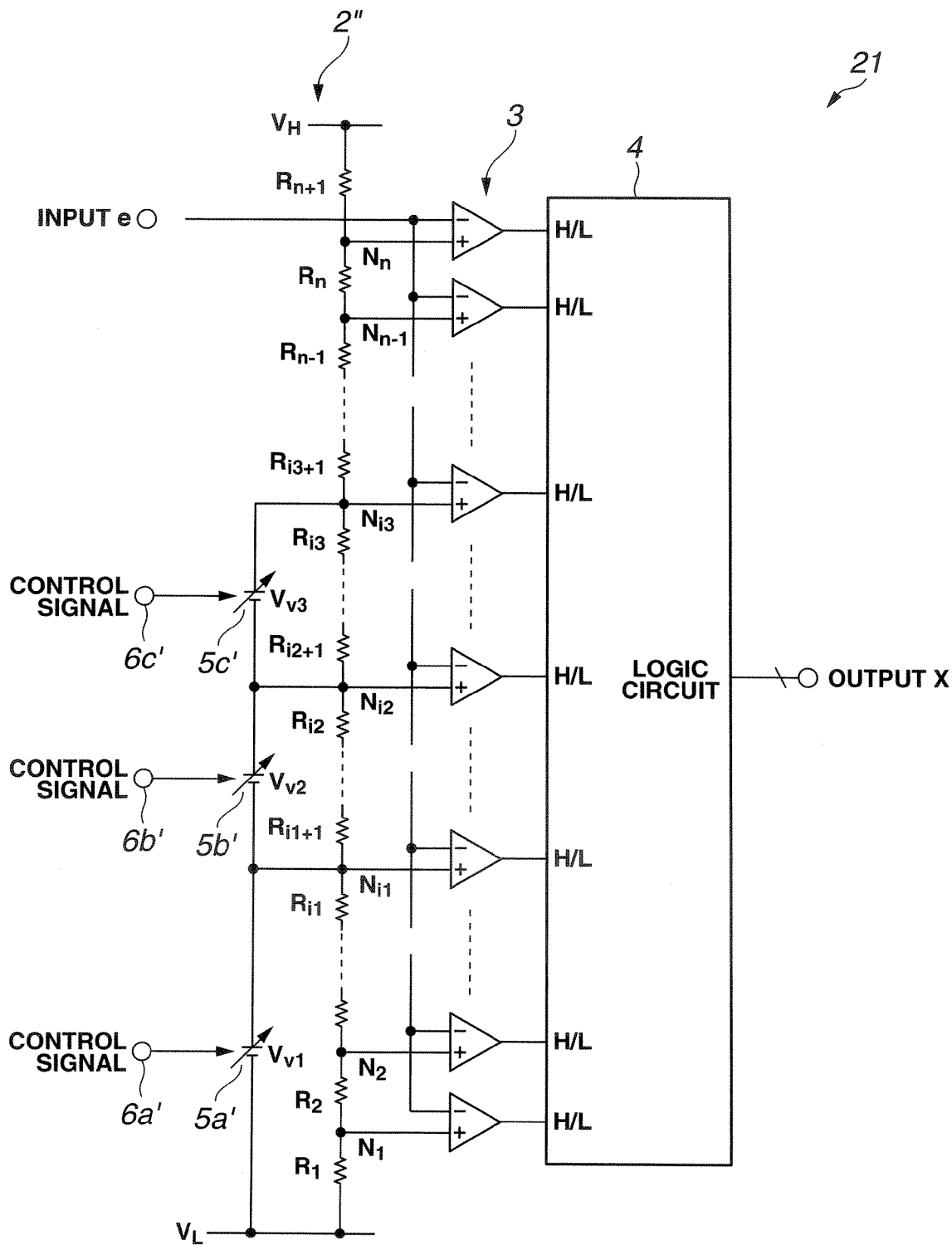
FIG. 9 is a schematic circuit diagram for explaining a configuration of still another AD converter 21 according to an embodiment of the present invention.

Alternatively, as shown in FIG. 9, conversion characteristics having three curving points can be achieved by configuring an AD converter 21 by using three variable voltage generators 5a', 5b' and 5c' in cascade connection, with one end of the variable voltage generator 5a' (one end of the cascade variable voltage generators) connected to an open end of the lower potential resistor $R_1$, a connecting point between the variable voltage generators 5a' and 5b' connected to the reference node $N_{i1}$, a connecting point between the variable voltage generator $5b'$ and $5c'$ connected to the reference node $N_{i2}$, and one end of the variable voltage generator $5c'$ (the other end of the cascade variable voltage generators) connected to the reference node $N_{i3}$. FIG. 9 is a schematic circuit diagram for explaining a configuration of another AD converter 21 according to an embodiment of the present invention.

Each of the above embodiments have been described taking as an example a parallel AD converter having the nonlinear characteristics with one or three curving points. However, the present invention is not limited to the embodiments described above, but various modifications, alterations or the like can be made within a scope not departing from the spirit of the present invention. For example, the curving points in the conversion characteristics may be four or more. Alternatively, another type of AD converter, such as a subrange type, instead of the parallel type may be configured, so that reference voltages inputted to comparators can be controlled from outside using a variable voltage generator.

As described above, according to the present embodiment, an AD converter and a display unit, which enables dynamic change of conversion characteristics, can be realized.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. An AD converter comprising:
   a reference voltage generator circuit having a plurality of resistors connected in series with a predetermined reference voltage applied to both ends thereof, said reference voltage being divided at connecting points between respective ones of said plurality of resistors to generate a plurality of reference voltages;
   a voltage comparator circuit configured to compare said plurality of reference voltages and analog input signals for conversion into predetermined comparison output signals; and
   a variable voltage circuit connected to a connecting point of said reference voltage generator circuit and provided with a control signal input terminal inputted with control signals, configured to set an output voltage to be outputted to said connecting point at a first predetermined value based on said control signals,
   wherein said output voltage of said variable voltage circuit is varied, so that a ratio of a potential difference between said connecting point connected with said variable voltage circuit and said connecting point juxtaposed, on a higher potential side, to said connecting point, to a potential difference between said connecting point connected with said variable voltage circuit and said connecting point juxtaposed, on a lower potential side, to said connecting point, is varied to a second predetermined value.

2. The AD converter according to claim 1, wherein said variable voltage circuit is provided with a plurality of variable voltage generators, said plurality of variable voltage generators being each connected to a different one of said connecting points.

3. The AD converter according to claim 2, wherein said output voltage of each of said plurality of variable voltage generators is varied, so that a ratio of a potential difference between said connecting point connected with each of said plurality of variable voltage generators and said connecting point juxtaposed, on the higher potential side, to said connecting point, to the potential difference between said connecting point connected with said variable voltage generator and said connecting point juxtaposed, on the lower potential side, to said connecting point, is varied to the second predetermined value.

4. The AD converter according to claim 2, wherein said plurality of variable voltage generators are in cascade connection.

5. The AD converter according to claim 4, wherein said output voltage of each of said plurality of variable voltage generators is varied, so that a ratio of a potential difference between said connecting point connected with each of said plurality of variable voltage generators and said connecting point juxtaposed, on the higher potential side, to said connecting point, to the potential difference between said connecting point connected with said variable voltage generator and said connecting point juxtaposed, on the lower potential side, to said connecting point, is varied to the second predetermined value.

6. A display unit comprising:
   an AD conversion part including a reference voltage generator circuit having a plurality of resistors connected in series with a predetermined reference voltage applied to both ends thereof, said reference voltage being divided at connecting points between said respective ones of said plurality of resistors to generate a plurality of reference voltages, a voltage comparator circuit configured to compare said plurality of reference voltages and analog image signals for conversion into predetermined comparison output signals and a variable voltage circuit connected to a connecting point of said reference voltage generator circuit and provided with a control signal input terminal inputted with control signals, configured to set an output voltage to be outputted to said connecting point at a first predetermined value based on said control signals;
   an image analysis part configured to analyze digital image signals outputted from said AD conversion part to output said control signals and image correction signals; and
   an image correction part configured to correct and process said digital image signals based on said image correction signals.

7. The display unit according to claim 6, wherein said output voltage of said variable voltage circuit is varied, so that a ratio of a potential difference between said connecting point connected with said variable voltage generator and said connecting point juxtaposed, on a higher potential side, to said connecting point, to a potential difference between said connecting point connected with said variable voltage generator and said connecting point juxtaposed, on a lower potential side, to said connecting point, is varied to a second predetermined value.

8. The display unit according to claim 7, wherein said image analysis part outputs an expansion rate of a quantization width of said analog image signals on said higher potential side and an expansion rate of a quantization width of said analog image signals on said lower potential side, in the form of said image correction signals.

9. The display unit according to claim 8, wherein said image analysis part outputs, on said higher potential side and said lower potential side, said control signals for narrowing the quantization width for a region on a contrast-enhancing side and for expanding the quantization width for a region on a contrast-reducing side.

10. The display unit according to claim 9, wherein said image correction part performs correction so that the quantization width in the region on said higher potential side and the quantization width in the region on said lower potential side are made equal to each other.

11. The display unit according to claim 6, wherein said variable voltage circuit is provided with a plurality of variable voltage generators, said plurality of variable voltage generators being each connected to a different one of said connecting points.

12. The display unit according to claim 11, wherein said output voltage of each of said plurality of variable voltage generators is varied, so that a ratio of a potential difference between said connecting point connected with each of said plurality of variable voltage generators and said connecting point juxtaposed, on a higher potential side, to said connecting point, to a potential difference between said connecting point connected with said variable voltage generator and said connecting point juxtaposed, on a lower potential side, to said connecting point, is varied to the second predetermined value.

13. The display unit according to claim 11, wherein said plurality of variable voltage generators are in cascade connection.

14. The display unit according to claim 13, wherein said output voltage of each of said plurality of variable voltage generators is varied, so that a ratio of a potential difference between said connecting point connected with each of said plurality of variable voltage generators and said connecting point juxtaposed, on a higher potential side, to said connecting point, to a potential difference between said connecting point connected with said variable voltage generator and said connecting point juxtaposed, on a lower potential side, to said connecting point, is varied to a second predetermined value.

15. The display unit according to claim 12, wherein said image analysis part outputs an expansion rate of a quantization width of said analog image signals on said higher potential side and an expansion rate of a quantization width of said analog image signals on said lower potential side, in the form of said image correction signals.

16. The display unit according to claim 15, wherein said image analysis part outputs, on said higher potential side and said lower potential side, said control signals for narrowing the quantization width for a region on a contrast-enhancing side and for expanding the quantization width for a region on a contrast-reducing side.

17. The display unit according to claim 16, wherein said image correction part performs correction so that the quantization width in the region on said higher potential side and the quantization width in the region on said lower potential side are made equal to each other.

18. The display unit according to claim 13, wherein said image analysis part outputs an expansion rate of a quantization width of said analog image signals on said higher potential side and an expansion rate of a quantization width of said analog image signals on said lower potential side, in the form of said image correction signals.

19. The display unit according to claim 1, wherein said image analysis part outputs, on said higher potential side and said lower potential side, said control signals for narrowing the quantization width for a region on a contrast-enhancing side and for expanding the quantization width for a region on a contrast-reducing side.

* * * * *